United States Patent [19]

Sunter et al.

[11] Patent Number: 4,885,625
[45] Date of Patent: Dec. 5, 1989

[54] INTEGRATED CIRCUIT CHIP MANUFACTURE

[75] Inventors: Stephen K. Sunter, Nepean; Go S. Sunatori, Ottawa, both of Canada

[73] Assignee: Northern Telecom Limited, Montreal, Canada

[21] Appl. No.: 330,952

[22] Filed: Mar. 23, 1989

Related U.S. Application Data

[63] Continuation of Ser. No. 826,652, Feb. 6, 1986, abandoned.

[51] Int. Cl.$^4$ ............................................. H01L 27/04
[52] U.S. Cl. .......................................... 357/45; 357/42
[58] Field of Search ............................ 357/40, 45, 42; 364/490, 491; 307/465

[56] References Cited

U.S. PATENT DOCUMENTS

| | | | |
|---|---|---|---|
| 3,943,551 | 3/1976 | Skorup | 357/42 |
| 4,161,662 | 7/1978 | Malcolm et al. | 357/41 |
| 4,575,745 | 3/1986 | Sharma et al. | 357/45 |

FOREIGN PATENT DOCUMENTS 56-122142  9/1981  Japan .
57-15540   1/1982  Japan ................................. 364/490

OTHER PUBLICATIONS

"Optimal Synthesis of Arbitrary Switching Functions with Regular Arrays of 2-Input 1-Output Switching Elements", C. Dennis Weiss, IEEE Transactions on Computers, vol. C16, No. 9, Sep. 1969.
"Rectangular Universal Iterative Array", M. Davio et al., Electronic Letters, Oct. 18, 1973, vol. 9, No. 21.
"Channel-Order Router-A New Routing Technique for a Masterslice LSI", Journal of Digital Systems, vol. IV, Issue 4, 1981, Computer Science Press, Inc.

Primary Examiner—William D. Larkins
Attorney, Agent, or Firm—C. W. Junkin

[57] ABSTRACT

An integrated circuit has integrated circuit cells drawn from a library. The cells are rectangular with input lines extending from both sides of the cell to a logic element on the cell and outputs taken from the logic element to both sides of the cell. Input and output lines terminate at connection points. Short linear lengths of conductors selectively interconnect the connection points across the boundary between adjacent cells. The arrangement permits on-cell series and parallel connection of cells.

13 Claims, 5 Drawing Sheets

INTEGRATED CIRCUIT CHIP MANUFACTURE

This application is a continuation of application Ser. No. 826,652 filed Feb. 6, 1986 in the names of Stephen K. Sunter and Go S. Sunatori and entitled "Integrated Circuit Chip Manufacture". The specification and drawings of application Ser. No. 826,652 are hereby incorporated by reference. Application Ser. No. 826,652 is now abandoned.

This invention relates to integrated circuit chips and particularly to such chips which are fabricated using integrated circuit cells drawn from a library of such cells.

Since it is impossible for designers to draw out circuit elements at the microscopic scale currently characterizing VLSI circuits, the circuits are first mapped-out on paper at many times the circuit final size. The first map produced shows a collection of electronic logic blocks (gates, inverters, etcetera). This is then translated into a diagram of the electrical elements (transistors, resistors, etcetera) that will perform the required functions when fabricated in silicon or another semiconductor. Contained within this drawing is all the data required to generate photomasks used in the production of the chip. A series of photographic reductions are employed to reduce the photomask drawings to the requisite final size.

To cope with ever increasing complexities of integrated circuit design, it has been proposed to use automated cellular or modular lay-out systems. In such a system a family of standard "cells" each one representing an electrical logic function such as a logic NAND gate is represented by a functional diagram and is also stored as a thoroughly tested computer model which realistically simulates the behaviour of the cell. In the design of a logic circuit, the standard cells are used as building blocks, and are combined to generate the required function. These logic cells are translated by computer program into corresponding proven circuit lay-outs which are displayed on a terminal. An integrated circuit designer can then manipulate the standard cells which may not be in the exact form that they will be implemented in the silicon but are in a form showing the physical shape, arrangement of connections and other details necessary for the actual lay-out on a chip. Each of the standard cells such as NAND and NOR gates, counters and signal inverters have to conform to stored rules governing parameters such as size, and the location of inputs and outputs. Also the cells must be electrically and logically compatible with one another. With a cellular design method, the interior details of the standard cells are already designed and proven, thus eliminating a considerable amount of design work in generating a new chip design.

In the simplest approach to generating an integrated circuit using cells, a row and track approach is used. This approach employs rectangular cells of a uniform height which are placed side-by-side in the chip lay-out to form a row. An integrated circuit consists of several of these rows with interconnections or tracks, routed in the space between the rows. To simplify the interconnection pattern, a grid system is used, the height of all the cells being a common number of grid intervals and their widths being restricted to an integral number of grid intervals. Interconnection points on each cell appear at locations that are an integral number of grids from an assigned cell origin position. Interconnections between the cells extend along the grid lines, horizontal interconnection links being made below the bottom edge of a row of cells. The interconnection pattern may take up several rows of the grid and may occupy several levels of polysilicon or metal in the chip. In arranging the cells for maximum packing density and minimum interconnect, it is known to reverse the cells (top-to-bottom or side-to-side), this function being easily achieved using computer-aided design.

In addition to the use of dedicated interconnect regions for example along the bottom of a row of integrated circuit cells, it is known to provide a connection between the sides of adjacent cells. Thus, in addition to input and output lines terminating at the top and bottom edges of such a cell, such cells will also have an input and an output line terminating just short of respective cell sides. The cells are designed such that when the two adjacent cells are placed in a row, the output line end (or connection point) of one cell has a predetermined location relative to the connection point of the input line of the next adjacent cell. Consequently, at the design stage, a routine can be initiated in the computer-aided design process which applies a predetermined interconnect line to join the two ends and so connect the side-sited output of the first cell to the side-sited input of the next cell across a notional boundary between the cells. Clearly dedicated interconnect space between the cell rows is obviated. Henceforth, these side-sited connections across a boundary shall be called "join cells".

Frequently both parallel and series connections of two particular cells will be required to perform the circuit logic function. For parallel connection, where the cells meet there will either be a common input to or common output from the two cell logic elements. The other common connection can be implemented only by a dedicated interconnect along the top or bottom of the cell row, outside the cell boundaries.

The inputs and outputs of standard cells are interconnected by forming conducting lines in metal and/or polysilicon layers formed on the chip to join a connection point of one cell with a connection point of another cell. Access to inputs and outputs in both metal and polysilicon layers is advantageous where interconnection paths must cross because the conductor paths in one direction can be run in one conducting layer, while the perpendicular paths are run in another conducting layer.

This prior design scheme in which there is essentially a dedicated input side and a dedicated output side in each cell and in which signals propagate essentially unidirectionally through the cell is expensive on interconnect area outside the cells. At the expense of some conductor area within the confines of each cell, many of these off-cell interconnects can be eliminated.

According to the invention, there is provided an integrated circuit chip having a plurality of integrated circuit cells, each cell containing a logic element, at least two input terminals each of which is connected to an input of the logic element, and at least two output terminals each of which is connected to an output of the logic element, a respective one of the input terminals and a respective one of the output terminals being located at each of two opposite sides of each cell, and the cells being arranged side by side with at least one of said opposite sides of each cell being located next to one of said opposite sides of an adjacent cell to bring terminals of each cell into adjacency with terminals of at least one adjacent cell.

Preferably, the terminals at each side of each cell are equispaced and the pair of terminals at one side of the cell are an equal distance from a bottom or top boundary of the cell as the spaced terminals at the other side of the cell.

Input and output conductors associated with each logic element can be such as to produce vertically coincident terminals whereby interconnection between adjacent cells can be implemented in one of a plurality of separate conductor levels, the conductor levels being insulated one from another. An integrated circuit embodying the invention preferably has a lower polysilicon conducting layer and an upper aluminum conducting layer.

The cells and terminals of the input and output conductors are preferably located on a Cartesian grid system, the cell areas being rectangular in shape.

Each cell can occupy a preset number of grid spacings in height and an integer number of grid spacings in width depending on the size of a logic element contained therein. Some of the cells within the integrated circuit can be mirror images or inversions of other cells. The join cells preferably comprise a short linear length of conductor.

By routing input and output lines to both sides of each cell, two cells can be located side-by-side to provide a series connection between them or one of the two cells can be inverted and the connection scheme altered to provide a parallel connection between the cells.

Embodiments of the invention will now be described by way of example with reference to the accompanying drawings in which.

Figure 3:
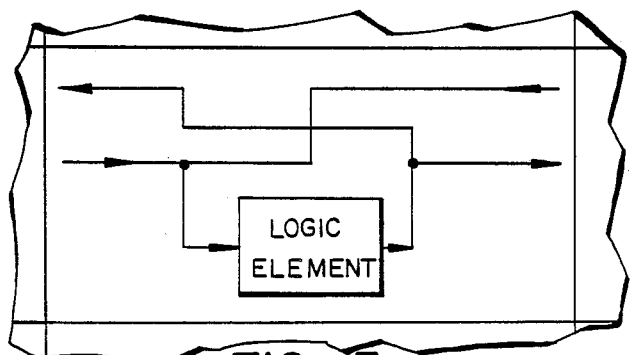
FIG. 3 shows a circuit schematic drawing of a cell.
Figure 7:
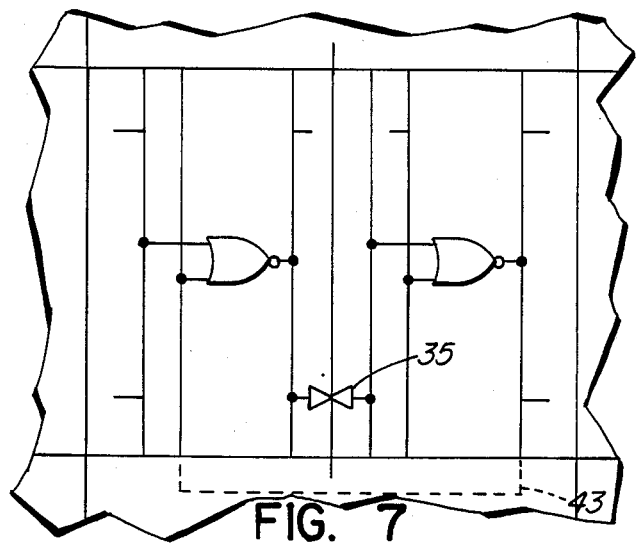
Figure 8:
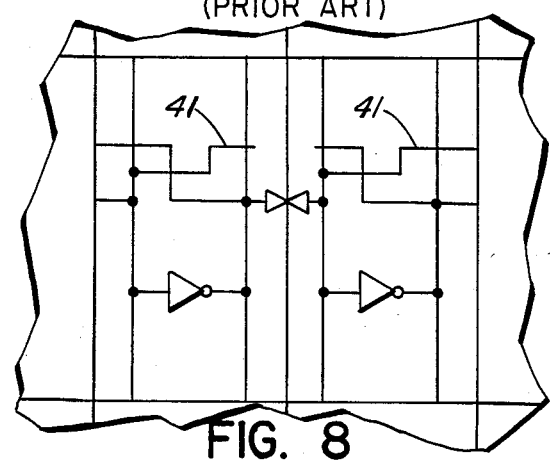
Figure 9:
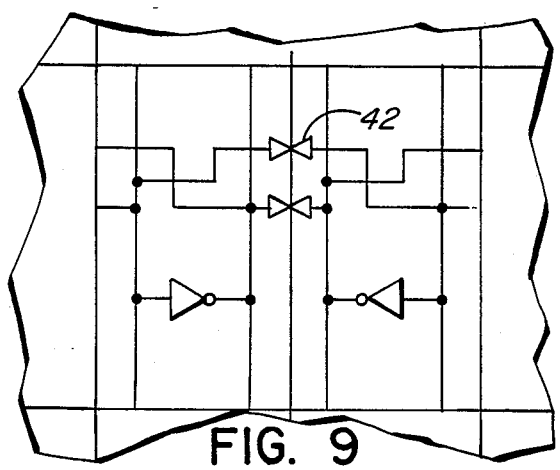
Figure 10:
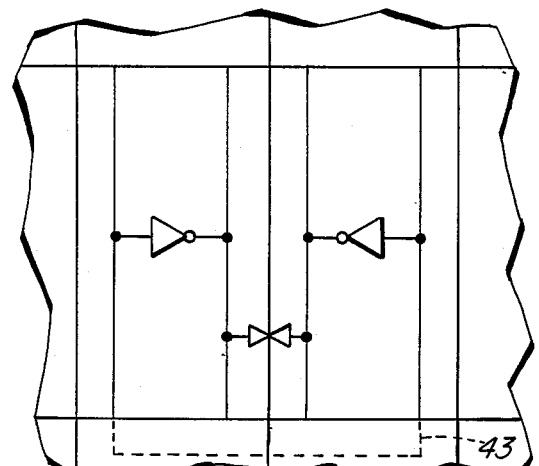
Figure 11:
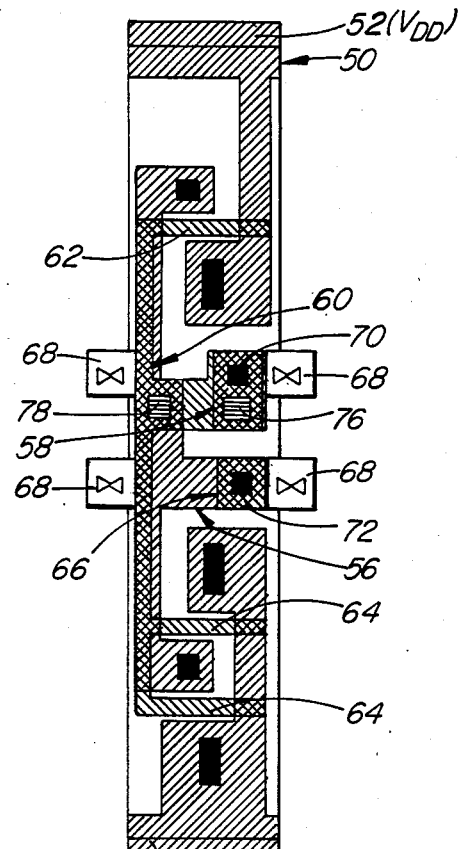
Figure 12:
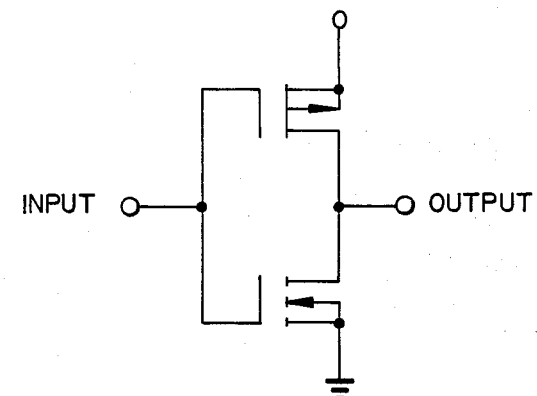

FIG. 7 marked PRIOR ART shows a SR flip-flop implemented using known integrated circuit cell technology;

FIGS. 8 and 9 respectively show circuit schematic views of series and parallel connected inverter cells embodying the invention;

FIG. 10 marked PRIOR ART shows a parallel connected inverter using known integrated circuit technology;

FIG. 11 shows superimposed photomask outlines used in the production of the FIG. 3 cell;

FIG. 12 is a circuit diagram of a standard CMOS inverter; and

Figure 13A:
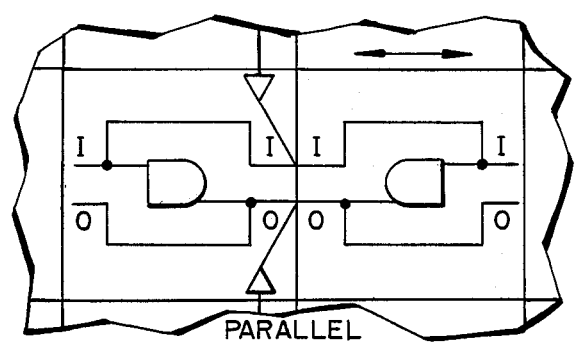
Figure 13B:
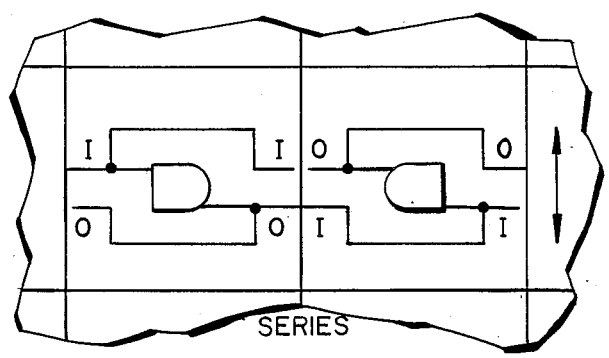

FIGS. 13(a) and 13(b) are schematic views showing an alternative embodiment of the invention.

Figure 1:
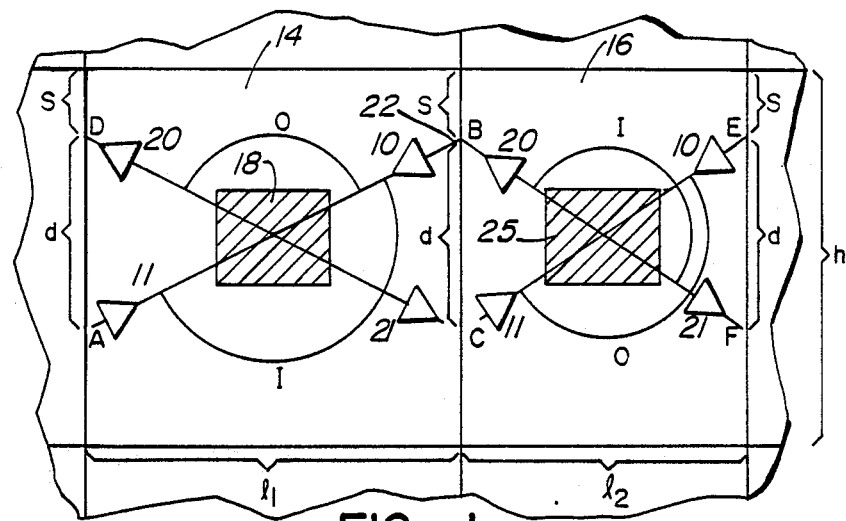
FIG. 1 is a schematic representation of part of an integrated circuit chip having a pair of series connected logic cells.

Referring to FIG. 1 in detail, the schematic view shows an arrangement of logic cells 14, 16 on part of an integrated circuit chip embodying the invention. The first logic cell 14 has a height "h" and length "$l_1$" and contains a logic element 18. A first input line 11 extends from a terminal A to the logic element 18 and a second input line 10 extends to the logic element from a terminal B. Terminals A and B are diagonally opposite at the sides of the cell rectangle. Corresponding output lines 21 and 20 extend from the logic element to terminals C and D where C and D are on the cell boundary and at diagonally opposite points. The terminals B and D are both a distance "s" from the top side or origin of the cell and the terminals A and D have a spacing "d" identical to the spacing of terminal B and C.

Integrated circuit cell 16 has a height identical to the logic cell 14 and a length "$l_2$" somewhat less than "$l_1$" owing to a logic element 25 having an area smaller than logic element 18. The internal connection scheme of cell 16 is essentially that of cell 14 translated to the right. Thus inputs 11 and 10 extend from points C and E respectively to the logic element 25 and outputs 20 and 21 appear respectively at points B and F. It can be seen that the output 21 of the logic cell 14 and input 11 of the logic cell 16 terminate and originate respectively at point C while input 10 of logic cell 14 and output 20 of logic cell 16 terminate at point B.

In fact, the input and output lines all terminate short of the boundary between the cells. In the embodiment shown no connection exists between the lines terminating near C but the lines terminating at B are joined by a short interconnect line or join cell 22. The junction interconnect 22 completes a current path through the two logic cells 14 and 16 from the point E through the logic element 25, across junction point B, through the logic element 18 to the point D. It will be realized that in an alternative series connection using the identical logic cells 18 and 25, the junction interconnect is placed at the point C so that a series path extends through the two logic elements 18, 25 from point A through point C to point F.

Figure 2:
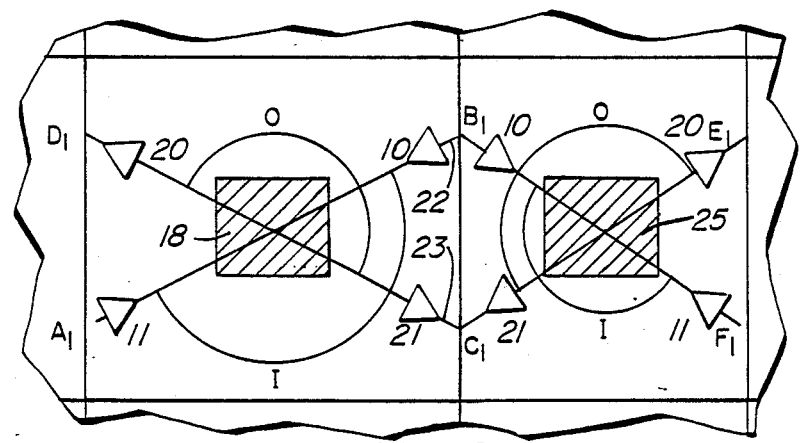
FIG. 2 is a schematic representation similar to FIG. 1 but showing two such cells connected in parallel.

Referring now to FIG. 2, an alternative arrangement of the two cells is shown. Here, the logic elements 25 is inverted (left-to-right) compared to logic element 18. With join cells applied at 22 and 23, inputs to the combined logic elements 18, 25 can originate from an upper interconnect level (not shown) at $B_1$ and an output is available in the upper interconnect level at $C_1$, the elements thus being effectively connected in parallel with additional outputs being available at both $D_1$ and $E_1$.

Referring to FIG. 3, the schematic diagram shows one arrangement of the routes of input and output lines to and from a logic element.

Figure 4:
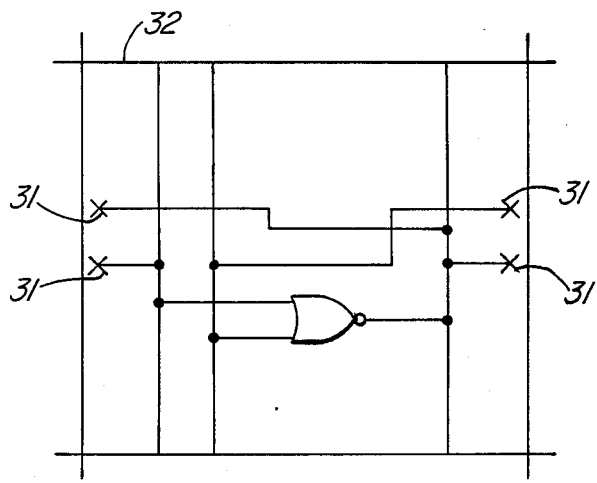
FIG. 4 shows a circuit schematic drawing of a NOR gate embodying the invention.
Figure 5:
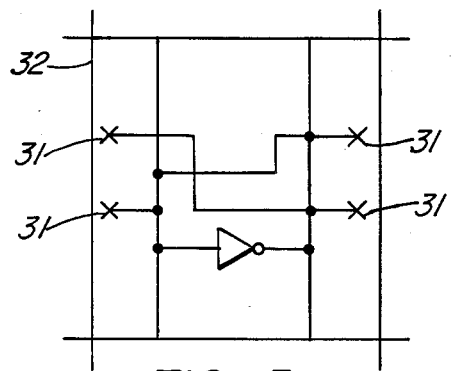
FIG. 5 shows a circuit schematic drawing of an inverter embodying the invention.

Referring to FIGS. 4 and 5, a two-input NOR gate and an inverter are shown. It will be understood that the logic element and interconnect shown correspond, in a silicon wafer, to an array of transistors and to a pattern of conductor areas. However connection points 31 of the conductor lines shown in the Figure correspond essentially to connection points on the center line of conductors implemented in wafer form and are properly positioned relative to the outer perimeter 32 of the cells.

Figure 6:
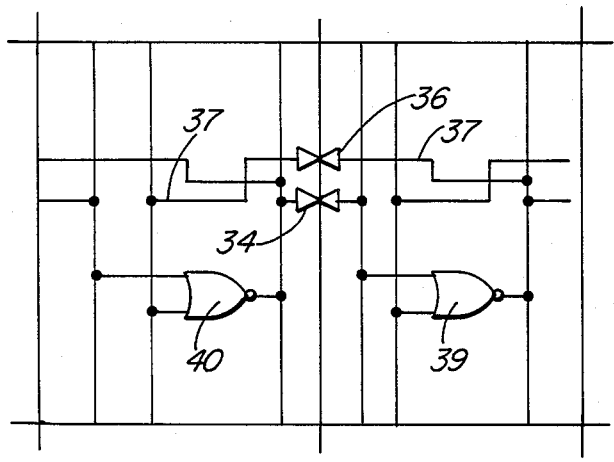
FIG. 6 shows a circuit schematic view of a SR flip-flop embodying the invention.

Referring to FIG. 6, a pair of the two-input NOR gates are shown in A SR flip-flop arrangement. Also shown for comparison in FIG. 7 is a SR flip-flop implemented using known integrated circuit cells. In the FIG. 6 version, a lower interconnection 34 between cells corresponds to the single on-cell interconnection 35 of FIG. 7. A second interconnection 36 and conducting leads 37 extending to and from it are used to implement a reverse current path to take the output from a second NOR gate 39 back to the input of a first NOR gate 40 without the use of off-cell interconnect 43 as shown in FIG. 7.

In FIGS. 8 and 9 there are shown series and parallel connected inverters while FIG. 10 shows a parallel connected inverter arrangement implemented in known integrated circuit cell technology. In FIG. 8, additional conducting lines 41 for permitting a reverse current path across each of the cells are redundant. However in the case of the parallel inverters, by forming a second connection 42, a reverse path is implemented and the need for off-cell interconnect 43 shown in FIG. 9 is obviated.

In the examples shown, each of the cells is primitive in the sense that the logic element cannot really be split into subsidiary logic functions. However a combination cell produced by putting two of the primitive cells together does itself resemble a primitive cell in the sense that inputs and outputs having identical positional relationship are available at both sides of the combination cell.

In the example shown, a join between adjacent cells is shown as a symbol as shown, for example, at reference numeral 36 in FIG. 6, at reference numeral 35 in FIG. 7, and at reference numeral 42 in FIG. 9. In fact, the circuit design software is programmed to position a length of conductor. This is preferably short and straight but can be somewhat longer and non-linear if appropriate in view of other design rules for use of the cell library. In translating the logic diagram shown in the Figures to a series of masks and in translating the masks to an integrated circuit wafer, the existence of discrete cells is lost in the sense that no boundary between primitive cells or combination cells will be apparent and no discrete join cell is apparent although at certain locations a span of metal will traverse the boundary between cells. However in the particular embodiment described, the cell nature of the chip will be apparent on analysis since in a row of logic elements, the elements each have two input and two output lines, one each of the input and output lines leading directly to respective adjacent sides of the cell and the other input and output lines looping towards opposite sides of the cell.

Referring to FIG. 11 there is shown to an enlarged scale a mask diagram for the CMOS inverter shown schematically in FIG. 5 and in circuit schematic form in FIG. 12.

The outer boundary of the cell is shown at 50. The inverter has a top aluminum region 52 to which $V_{DD}$ is applied in operation and a lower aluminum region 54 to which $V_{SS}$ is applied. Further aluminum regions are located at 56 and 58. One polysilicon area 60 extends between a p-channel transistor 62 and an n-channel transistor arrangement 64 and a smaller polysilicon region exists at 66. It can be seen that at all elements or points 68 both aluminum and polysilicon extend close to the sides of the cell, the polysilicon being at a different wafer level from the aluminum.

On the right-hand side, (i) the polysilicon region 60 and aluminum region 58 and (ii) the polysilicon region 66 and aluminum region 56, are electrically joined by vertical contacts 70 and 72 respectively. The contact 70 represents an input port and the contact 72 an output port.

The polysilicon area 60 and the aluminum area 56 both extend through to the left hand side of the cell at their respective levels. Connections can be made at either of the two levels and at any of the points 68 in order to achieve the desired interconnection with a neighbouring cell to the left or right of the inverter cell illustrated. Join cell locations are shown schematically as elements 68 which, as previously indicated, may be at the polysilicon or aluminum metal level. The arrangement permits implementation of either of the connection schemes shown in FIGS. 1 and 2.

Also shown in FIG. 11 are vias 76, 78 which provide connection between a second aluminum level (not shown) and the first aluminum level. The second level aluminum can be used to provide inputs to and outputs from a row of cells at selected positions along the row. The second level metal can also be used for general routing in the wafer if cell connections are not made at via locations 76 or 78. Essentially, the more join cells that are utilized in a cell row, the more optional input or output terminal sites become available at via locations 76, 78 for routing second level metal interconnect lines.

In the embodiments of FIGS. 1 to 11, the cells are rectangular. However it is possible to have cells of alternative polygonal shape with appropriately routed input and output leads.

In the embodiment specifically described, the two output connection points of a cell can be viewed as located at the ends of one cell diagonal with the two input connections located at the ends of the other diagonal. Together with a computer-aided design routine permitting the cell plan to be reversed (left to right), this enables the parallel and series connection of cells described previously.

In an alternative embodiment (FIG. 13) the two inputs is are taken from connection points on opposed sides at a common height and the two outputs 0 are taken to connection points at opposed sides at a different common height. The required parallel connection of cells is achieved by reversing an adjacent cell left-to-right (FIG. 13(a)) and the series arrangement is achieved by inverting the adjacent cell top-to-bottom (FIG. 13(b)). However, this solution is not preferred because of the difficulty of making connection to ground and supply voltage lines at top and bottom of a cell row.

What is claimed is:

1. An integrated circuit device having a plurality of integrated circuit cells, each cell containing o logic element, at least two input terminals each of which is connected to an input of the logic element, and at least two output terminals each of which is connected to an output of the logic element, a respective one of the input terminals and a respective one of the output terminals being located at each of two opposite sides of each cell with the input terminal at one of said opposite sides of the cell being diagonally opposite the input terminal at the other of said opposite sides and the output terminal at said one of said opposite sides being diagonally opposite the output terminal at said other of the opposite sides, and the cells being arranged side by side with at least one of said opposite sides being located next to one of said opposite sides of an adjacent cell to bring terminals of each cell into adjacency with terminals of at least one adjacent cell.

2. An integrated circuit device as defined in claim 1, wherein at least one of said terminals of at least one of said cells is joined to an adjacent terminal of a cell located adjacent to said cell.

3. An integrated circuit device as defined in claim 2 having cells of at least two types, cells of one of said types having input terminals at a first pair of locations at opposite sides of said cells and output terminals at a second pair of locations at opposite sides of said cells, and cells of a second of said types having output terminals at said first pair of locations and input terminals at said second pair of locations.

4. An integrated circuit as defined in claim 3, wherein each cell of said one type corresponds to a cell of said other type, said cells being mirror images of one another.

5. An integrated circuit device as defined in claim 3, wherein an output terminal of at least one of said cells is joined to an adjacent input terminal of a cell located adjacent to said cell to complete a series connection of the logic elements contained in said cell and said adjacent cell.

6. An integrated circuit device as defined in claim 3, wherein an input terminal of at least one of said cells is joined to an adjacent input terminal of a cell located adjacent to said cell and an output terminal of said cell is joined to an output terminal of said adjacent cell to complete a parallel connection of the logic elements contained in said cell and said adjacent cell.

7. An integrated circuit device as defined in claim 3, wherein the cells are arranged in at least one row, with end cells at each end of each row having one of said opposite sides located next to one of said opposite sides of an adjacent cell, and with cells between said end cells having each of said opposite sides located next to one of said opposite sides of a respective adjacent cell.

8. An integrated circuit device as defined in claim 7, wherein the integrated circuit cells are rectangular.

9. An integrated circuit device as defined in claim 8, wherein each cell in a particular row has an identical dimension in a direction transverse to said row.

10. An integrated circuit device as defined in claim 9, wherein each cell in said row has a dimension along said row which is an integral multiple of a predetermined grid dimension.

11. An integrated circuit device as defined in claim 10, wherein the terminals of each cell in each row are arranged along two parallel axes which extend parallel to each row.

12. An integrated circuit device as defined in claim 11, wherein the terminals are spaced apart along each of said axes by a distance which is an integral multiple of a predetermined grid dimension.

13. An integrated circuit device as defined in claim 12, wherein the input and output terminals of each cell are provided at a plurality of connection levels.

* * * * *